United States Patent [19]

Sakamoto

[11] 4,237,399
[45] Dec. 2, 1980

[54] DRIVING CIRCUIT FOR PIEZO-ELECTRIC MULTIMORPH TRANSDUCER

[75] Inventor: Hitoshi Sakamoto, Zama, Japan

[73] Assignee: Sony Corporation, Tokyo, Japan

[21] Appl. No.: 959,447

[22] Filed: Nov. 13, 1978

[30] Foreign Application Priority Data

Dec. 29, 1977 [JP] Japan ................. 52/158187

[51] Int. Cl.³ .......................................... H01L 41/08
[52] U.S. Cl. ..................................... 310/317; 310/332
[58] Field of Search ................................. 310/330–332, 310/317, 316, 358; 360/10, 11, 70, 75–78, 106–109

[56] References Cited

U.S. PATENT DOCUMENTS

| | | | |
|---|---|---|---|
| 3,054,084 | 9/1962 | Parssinen et al. | 310/331 X |
| 3,115,588 | 12/1963 | Hueter et al. | 310/332 |
| 3,592,967 | 7/1971 | Harris | 310/332 X |
| 3,760,203 | 9/1973 | Guntersdorfer et al. | 310/317 |
| 3,760,203 | 9/1973 | Guntersdorfer et al. | 310/317 |
| 3,794,410 | 2/1974 | Elliott | 310/332 X |
| 3,794,410 | 2/1974 | Elliott | 310/332 X |
| 3,940,974 | 3/1976 | Taylor | 310/331 X |
| 3,955,049 | 5/1976 | MacNeill | 310/332 X |
| 3,971,250 | 7/1976 | Taylor | 310/331 X |
| 4,099,211 | 7/1978 | Hathaway | 360/77 |
| 4,141,048 | 2/1979 | Kubota | 360/109 X |

FOREIGN PATENT DOCUMENTS 2537760  3/1977  Fed. Rep. of Germany ........... 310/332
2711703  11/1977  Fed. Rep. of Germany .

*Primary Examiner*—Mark O. Budd
*Attorney, Agent, or Firm*—Lewis H. Eslinger; Alvin Sinderbrand

[57] ABSTRACT

A piezo-electric transducer, such as, a bi-morph leaf, comprised of a pair of piezo-electric elements which are oppositely poled in opposite directions and interposed between inner and outer electrodes with each element being bonded to the other at the respective inner electrodes, is provided with a drive circuit applying a drive voltage across the outer electrodes, one of which is desirably grounded, for deflecting the transducer, and which clamps the voltage at the bonded together inner electrodes to a relatively small maximum value at least in response to a polarity of the drive voltage opposed to the direction in which one of the piezo-electric elements is poled so as to avoid substantial depolarization of at least that one element. The foregoing arrangement is particularly desirable in an apparatus in which a magnetic head is moved along a track on a magnetic tape or other record medium for reproducing information signals recorded in such track which the bi-morph leaf supports the head for deflecting the latter in a direction transverse to that along the track in response to the drive voltage.

13 Claims, 7 Drawing Figures

DRIVING CIRCUIT FOR PIEZO-ELECTRIC MULTIMORPH TRANSDUCER

BACKGROUND OF THE INVENTION

1. Field of the Invention

This invention relates generally to a drive circuit for a piezo-electric transducer, such as, a bi-morph leaf, and more particularly is directed to such bi-morph leaf and the drive circuit therefor in an apparatus for reproducing video or other information signals recorded in a track on a record medium, for example, as in a video tape recorder, and in which a magnetic head carried by the bi-morph leaf is made to accurately scan the track in response to a drive voltage applied by the drive circuit to the bi-morph leaf.

2. Description of the Prior Art

It is known to bond together a pair of piezo-ceramic elements to form a bi-morph leaf, and to apply a deflection voltage to the elements so as to cause them to bend or deflect along a lengthwise direction of the leaf. The individual ceramic elements which make up the bi-morph leaf are made of a high-dielectric constant polycrystalline material which acquires piezo-electric properties when it is poled or polarized by being subjected to a strong unidirectional voltage.

If a pair of electrically poled piezo-ceramic elements interposed between inner and outer electrodes are bonded to each other at the respective inner electrodes, and a voltage is applied between the bonded-together inner electrodes and the outer electrode of each element such that the voltage is in the poling direction of one element and opposed to the poling direction of the other element, the bending effect is multiplied in respect to that obtainable with only a single piezo-ceramic element. However, in any case where a large amount of bending is required, correspondingly large deflection voltages have to be applied. Such large deflection voltage, when applied in a direction opposed to the poling direction of a piezo-ceramic or -electric element, tends to depolarize the element and reduce its future ability to bend or deflect.

One use of a bi-morph leaf requiring large deflections thereof is in supporting a magnetic head in a video tape recorder or VTR so that, as the magnetic head is moved along a track on a record medium in which video or other information signals are required, a drive voltage or signal can be applied to the bi-morph leaf for deflecting the head in a direction transverse to the length of the track, for example, so as to maintain optimum positioning of the head in respect to the record track.

Arrangements have been proposed to provide relatively large amplitude, bidirectional deflections of a bi-morph leaf without depolarizing the latter, for example, as disclosed in the U.S. patent applications of Raymond Francis Ravizza, identified as Ser. No. 668,581, filed Mar. 19, 1976, and Ser. No. 677,828, filed Apr. 16, 1976, and both of which became known to the assignee of the present application by the opening to public inspection of a corresponding application filed on behalf of such applicant in a country foreign to the United States and in which copies of the identified U.S. applications were filed in support of a claim of priority. In such arrangements, the bonded together piezo-ceramic elements are given the same poling direction, and the deflection voltages applied to the piezo-ceramic elements are made to have polarities in the same direction as the poling direction of the elements to which the deflection voltages are applied. More particularly, a DC bias voltage is applied to each piezo-ceramic element such that the applied voltage is in the poling direction of the element, and an AC deflection voltage is superposed on the DC bias voltage for controlling the deflection of the bi-morph leaf, with the magnitude of the bias voltage being sufficiently large to ensure that the net voltage applied to each piezo-ceramic element always has a polarity in the poling direction of that element.

The foregoing known arrangement for avoiding depolarizing of a bi-morph leaf is disadvantageous, particularly when the bi-morph leaf is employed for the mounting of a magnetic head on a rotary portion of a guide drum in a video tape recorder of VTR. More particularly, in such use of a bi-morph leaf, drive voltages or signals for deflecting the bi-morph leaf and thereby moving the magnetic head transversely in respect to the record track are applied through two drive amplifiers and respective bias sources to the outer electrodes, respectively, of the piezo-ceramic elements which have their bonded-together inner electrodes connected to ground. Thus, apart from the undesirable cost inherent in providing the two drive amplifiers and associated bias sources, the described arrangement according to the prior art requires a somewhat complicated structure for electrically insulating the magnetic head from the bi-morph leaf. Further, two slip rings are required for transmitting the drive voltages from the sources thereof to the rotary portion of the guide drum. Moreover, by reason of the DC bias voltages applied to the piezo-ceramic elements for avoiding the depolarizing thereof, the length of the bi-morph leaf tends to change over an extended period of time with the result that the projection of the magnetic head in respect to the peripheral surface of the guide drum is undesirably varied.

OBJECTS AND SUMMARY OF THE INVENTION

Accordingly, it is an object of this invention to provide a piezo-electric transducer of the type having a pair of electrically poled piezo-electric elements with a drive circuit for deflecting the transducer while avoiding depolarizing of the elements thereof and further avoiding the above-mentioned disadvantages of the prior art.

More particularly, an object of this invention is to provide a piezo-electric transducer, such as, a bi-morph leaf, with a drive circuit which avoids depolarizing of the piezo-ceramic or -electric elements making up the leaf, while permitting an outer electrode of the leaf to be connected to ground for facilitating the mounting of a magnetic head thereon without the need for insulation therebetween.

A further object is to provide a bi-morph leaf and drive circuit therefor, as aforesaid, which is of relatively simple construction, and in which, when the bi-morph leaf is employed for supporting the magnetic head in respect to a rotary portion of the guide drum in a video tape recorder, the drive voltage or signal for the bi-morph leaf can be transmitted to the rotary drum portion by way of a single slip ring.

Still another object is to provide a drive circuit for a bi-morph leaf, as aforesaid, in which changes in the length of the bi-morph leaf with time are avoided.

In accordance with an aspect of this invention, a piezo-electric transducer of the type having a pair of electrically poled piezo-electric elements interposed between inner and outer electrodes with the elements being bonded to each other at the respective inner electrodes, and with the elements being oppositely poled, is provided with a drive circuit comprised of a source of a drive voltage connected across the outer electrodes of the piezo-electric elements, respectively, for deflecting the transducer, and means for clamping, at a relatively small maximum value, the voltage at the bonded-together inner electrodes at least in response to a polarity of the drive voltage opposed to the direction in which one of the piezo-electric elements is poled so as to avoid substantial depolarization of at least that one element. Preferably, in the foregoing drive circuit according to this invention, the outer electrode of one of the piezo-electric elements is connected to ground, and the source of the drive voltage is connected between the outer electrode of the other piezo-electric element and the ground.

In the case where the drive voltage is an AC voltage, for example, for effecting a dither oscillation of the transducer or bi-morph leaf, the drive circuit further preferably includes means for clamping, at the relatively small maximum value, the voltage at the bonded-together inner electrodes in response to the polarity of the drive voltage opposed to the direction in which the other of the piezo-electric elements is poled so as to also avoid substantial depolarization of that other element.

In a desirable embodiment of the invention, each of the means for clamping the voltage includes unidirectional means, such as, a diode, connected across the respective piezo-electric element and polarized to permit current flow through the diode in a direction opposed to the direction in which the respective piezo-electric element is poled, and voltage limiting means, for example, constituted by a Zener diode, and which is connected in series with the unidirectional means.

The above, and other objects, features and advantages of the invention, will be apparent in the following detailed description of an embodiment thereof which is to be read in connection with the accompanying drawings.

DESCRIPTION OF A PREFERRED EMBODIMENT

Figure 1:
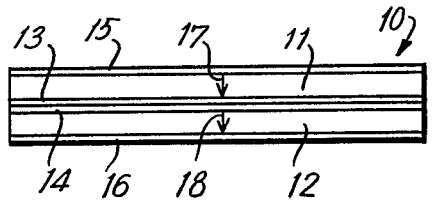
FIG. 1 is a schematic side elevational view of a bi-morph leaf according to the prior art, and which is shown on an enlarged scale.
Figure 2:
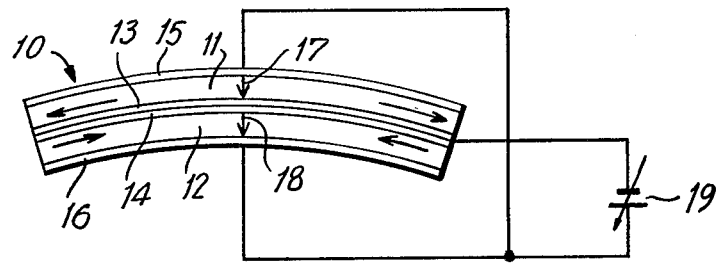
FIG. 2 is a schematic side elevational view similar to that of FIG. 1, but illustrating the deflection of the bi-morph leaf when a drive or deflection voltage is applied thereto.

Referring to the drawings in detail, and initially to FIG. 1 thereof, it will be seen that an existing piezo-electric transducer or bi-morph leaf 10 is comprised of a pair of piezo-electric or piezo-ceramic plates 11 and 12 which may be elongated and are interposed between inner and outer electrodes 13 and 15 and inner and outer electrodes 14 and 16, respectively, with the elements or plates 11 and 12 being bonded to each other at the respective inner electrodes 13 and 14. Further, the piezo-ceramic elements or plates 11 and 12 are shown to be electrically poled or polarized in a common direction, as represented by the arrows 17 and 18, respectively. When an electrical potential from a source 19 is impressed across each of the piezo-ceramic elements 11 and 12, for example, between outer and inner electrodes 15 and 13, and between outer and inner electrodes 16 and 14, as shown on FIG. 2, element or plate 11 expands and element or plate 12 contracts, so that bi-morph leaf 10 bends in the direction of its length to an extent dependent on the strength of the electric field applied thereto. If the polarity of the voltage applied from source 19 to bi-morph leaf 10 is reversed, the direction of bending of the leaf will be opposite to that shown on FIG. 2. However, it will be clear that, in either case, the voltage applied to one or the other of the piezo-ceramic elements 11 and 12 is in a direction opposed to the electrical poling thereof. Thus, if the potential or drive voltage applied from source 19 to bi-morph leaf 10 is made relatively large so as to obtain a large deflection, such voltage may cause depolarization of the element 11 or 12 which is poled in a direction opposed to the direction in which the large voltage is applied thereto.

Figure 3:
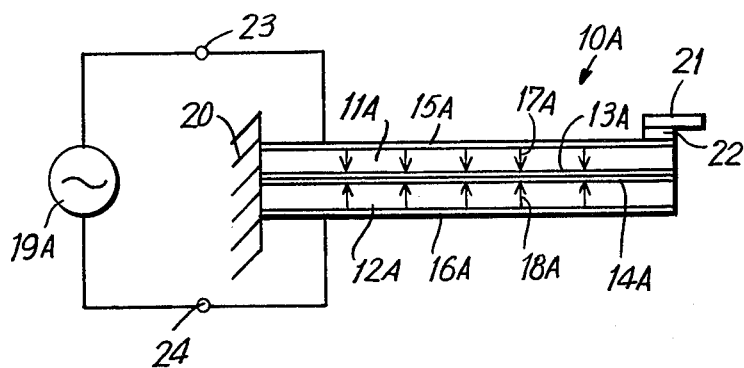
FIG. 3 is a schematic side elevational view showing another bi-morph leaf and a drive circuit therefor in accordance with the prior art for use in deflecting a magnetic head supported by the bi-morph leaf, as in a video tape recorder.

In a particular existing application of a bi-morph leaf 10A illustrated on FIG. 3, the piezo-ceramic elements 11A and 12A of the bi-morph leaf are again interposed between inner electrodes 13A and 14A and outer electrodes 15A and 16A, respectively, and are bonded together at their respective inner electrodes 13A and 14A, but the piezo-ceramic elements 11A and 12A are, in this case, shown to be electrically poled in opposed directions, as indicated by the arrows 17A and 18A. Further, bi-morph leaf 10A is cantilevered or supported at one end, as at 20, and a magnetic head 21 is mounted at the other or free end of bi-morph leaf 10A by means of an insulator 22 which spaces head 21 from outer electrode 15A. A drive circuit according to the prior art for causing deflection of bi-morph leaf 10A is shown to include a source 19A of an AC voltage which is connected, at its opposite sides, to outer electrodes 15A and 16A. The foregoing drive circuit is effective to deflect bi-morph leaf 10A alternately up and down so as to cause corresponding movements of magnetic head 21 at its free end. However, difficulties are experienced in mounting head 21 on bi-morph leaf 10A by reason of the necessity of providing insulator 22 between head 21 and electrode 15A so as to isolate the video or other information signals reproduced by head 21 from the drive or deflection signal applied to bi-morph leaf 10A from source 19A. Further, it will be appreciated that, in each half cycle of the AC drive voltage applied from source 19A to bi-morph leaf 10A, the polarity of such drive or deflection voltage is in a direction tending to depolarize either piezo-ceramic element 11A or piezo-ceramic element 12A. Moreover, if the structure 20 from which bi-morph leaf 10A is cantilevered is, for example, a rotary portion of a tape guide drum in a helical-scan video tape recorder or VTR, then two slip rings, indicated schematically at 23 and 24 on FIG. 3, are required for transmitting the drive or deflection voltage from source 19A to the rotary drum portion, and, thence, to the outer electrodes 15A and 16A of the bi-morph leaf.

Figure 4:
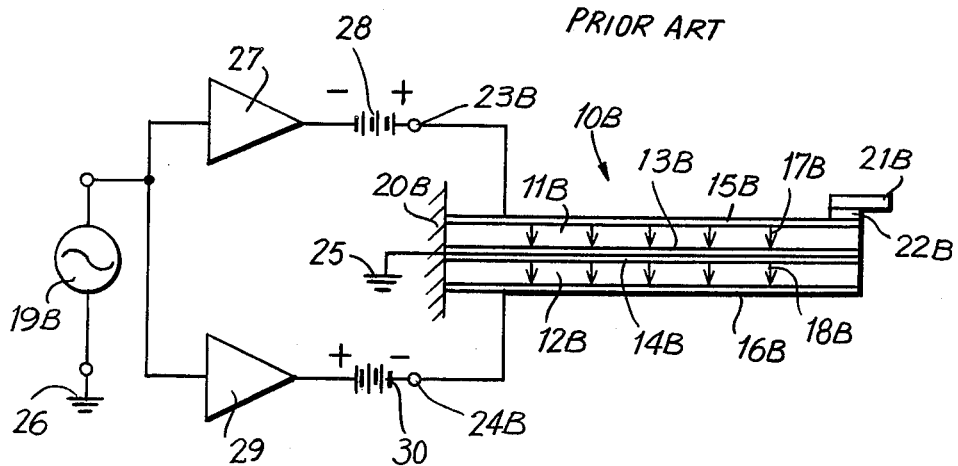
FIG. 4 is another schematic elevational view similar to that of FIG. 3, but showing another arrangement according to the prior art proposed for avoiding depolarizing of the electrically poled elements of the bi-morph leaf.

In order to avoid the depolarizing effect inherent in the arrangement of FIG. 3, it has been proposed, as shown on FIG. 4 and disclosed in detail in U.S. Pat. applications Ser. No. 668,581 and Ser. No. 677,828, identified more fully above, to provide a bi-morph leaf 10B with piezo-ceramic elements 11B and 12B which are electrically poled in the same or common direction, as indicated by the arrows 17B and 18B, and in which inner electrodes 13B and 14B, at which elements 11B and 12B are bonded together, are connected to ground, as at 25, for example, by way of a structure 20B to which one end of leaf 10B is cantilevered. Further, in the prior art arrangement of FIG. 4, the source 19B of an AC drive voltage is connected to ground at one side, as at 26, while the other side of source 19B is connected to outer electrode 15B through a driving amplifier 27 and a DC bias source 28 in series, and in parallel therewith through a series circuit of a driving amplifier 29 and a DC bias source 30 to outer electrode 16B.

The DC bias sources 28 and 30 are shown to be of opposite polarity so that the respective DC bias voltages, as applied therefrom to elements 11B and 12B, will act in the poling directions of piezo-ceramic elements 11B and 12B, respectively. Furthermore, the DC bias voltage of each of the sources 28 and 30 is preferably selected to be $\frac{1}{2}V_{max}$, wherein $V_{max}$ is the maximum peak-to-peak output voltage of the respective driving amplifier 27 or 29. Therefore, even if the output voltage of amplifier 27 or 29 is $\frac{1}{2}V_{max}$ or $-\frac{1}{2}V_{max}$, the voltage applied to the element 11B or 12B cannot be reversed in respect to the poling direction of the latter.

Although the prior art arrangement described above with reference to FIG. 4 is effective to avoid depolarizing of piezo-ceramic elements 11B and 12B, such arrangement is still burdened by a number of disadvantages. More particularly, in the case where bi-morph leaf 10B is employed for supporting a magnetic head 21B and deflecting the latter in response to the drive voltage or signal from source 19B, an insulator 22B has to be provided between head 21B and outer electrode 15B so that the signal reproduced by head 21B will be electrically isolated from the drive signal and, therefore, the mounting structure for head 21 becomes undesirably complicated. Further, in the event that the structure 20B from which bi-morph leaf 10B is cantilevered is a rotary portion of a tape guide drum, two slip rings 23B and 24B are again required, as shown on FIG. 4, for transmitting the drive signals to outer electrodes 15B and 16B, respectively, of the bi-morph leaf. The necessity of providing two driving amplifiers 27 and 29 and two DC bias sources 28 and 30 is a further disadvantage of the circuit shown on FIG. 4 in that increased complexity and costs are inherent therein. Moreover, by reason of the DC bias voltages continuously applied to piezo-ceramic elements 11B and 12B, the overall length of bi-morph leaf 10B tends to increase over an extended period of time. If leaf 10B is employed for mounting magnetic head 21B in respect to a rotary portion of the tape guide drum in a VTR, the mentioned increase in the length of bi-morph leaf 10B will undesirably change the extent to which head 21B projects beyond the peripheral surface of the tape guide drum.

Figure 5:
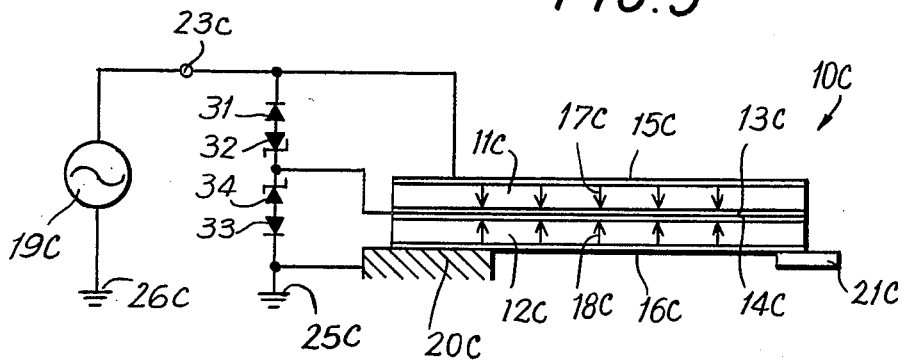
FIG. 5 is a schematic elevational view similar to that of FIG. 4, but showing an embodiment of the present invention.

Referring now to FIG. 5, it will be seen that, in accordance with the present invention, a piezo-electric transducer or bi-morph leaf 10C has its pair of piezo-electric or -ceramic elements or plates 11C and 12C electrically poled in opposite directions, as indicated by the arrows 17C and 18C, and such elements 11C and 12C are bonded together at their inner electrodes 13C and 14C. In the drive circuit according to this invention, a source 19C of an AC drive voltage is connected at one side to ground, as at 26C, while the other side of drive voltage source 19C is connected to outer electrode 15C of bi-morph leaf 10C. The other outer electrode 16C of leaf 10C is connected to ground, as at 25C, for example, through the structure 20C at which one end portion of leaf 10C is cantilevered. Since outer electrode 16C is grounded, a magnetic head 21C, for example, for reproducing video signals, can be directly and simply secured to the free end portion of leaf 10C at the outer electrode 16C thereof without the danger that there will be any interference between the video or other information signals reproduced by head 21C and the drive signal for deflecting leaf 10C.

Generally, in accordance with this invention, the drive circuit for bi-morph leaf 10C is further provided with means for clamping, at a relatively small maximum value, the voltage at the bonded together inner electrodes 13C and 14C at least in response to a polarity of the drive voltage from source 19C opposed to the direction in which one of the piezo-electric elements 11C and 12C is poled so as to avoid substantial depolarization of at least that one element. In the case where the drive voltage from source 19C is an AC voltage, the clamping means is preferably effective in respect to both polarities of the voltage at the bonded together inner electrodes 13C and 14C so as to avoid substantial depolarization of both elements 11C and 12C.

In the embodiment of the present invention illustrated on FIG. 5, the above described clamping means are constituted by a diode 31 and a Zener diode 32 connected in series between the bonded-together inner electrodes 13C and 14C and outer electrode 15C, and a diode 33 and Zener diode 34 connected in series between inner electrodes 13C and 14C and outer electrode 16C or the connection to ground at 25C. The diodes 31 and 33 are arranged to conduct in the directions in which elements 12C and 11C, respectively, are poled. Preferably, the Zener diodes 32 and 34 are selected to have a Zener voltage $V_z$ that is between $\frac{1}{3}E_{max}$ and $\frac{1}{2}E_{max}$, with $E_{max}$ being the maximum value of the voltage that may be applied to the element 11C or 12C in the direction in which the latter is poled to provide a substantially linear relation between the resulting deflection and the applied voltage value.

In the case where bi-morph leaf 10C is employed for mounting head 21C on a rotary portion of the tape guide drum in a VTR, such rotary portion of the drum may be of metal and grounded, and the diodes 31 and 33 and Zener diodes 32 and 34 can be made part of a cicuit assembly which is mounted on the rotary guide drum portion, with the result that only a single slip ring 23C is then required for applying the drive voltage or signal from source 19C to lead 10C.

The diodes 31 and 33 and Zener diodes 32 and 34 act as a voltage divider so that, if the drive voltage from source 19C is $\pm E$, a voltage of $\pm\frac{1}{2}E$ is applied to each of piezo-electric elements or plates 11C and 12C. When such voltage $\pm\frac{1}{2}E$ is lower than the Zener voltage $V_z$, that is, $\pm E < \pm 2V_z$, each of Zener diodes 32 and 34 is in its OFF state or condition so that bi-morph leaf 10C is driven by the voltage $\pm E$. If the drive voltage $\pm E$ is higher than $\pm 2V_z$, one or the other of the Zener diodes 32 and 34 is made conductive, or turned ON so that the voltage of the conductive Zener diode is clamped at $\pm V_z$. When the drive voltage is $+E > +2V_z$, diode 31 is reverse biased so that Zener diode 32 is in its OFF state, while diode 33 is forwardly biased with the result that Zener diode 34 is in its ON state. Therefore, the voltage at the junction point between Zener diodes 32 and 34 is clamped at $\pm V_z$. Although the voltage applied to piezo-electric element 12C is opposite to the poling direction thereof, the described clamping action ensures that such voltage is maintained at the constant, relatively small value $V_z$. Simultaneously, the voltage $(E - V_z)$ is applied to piezo-electric element 11C in the poling direction of the latter to effect upward deflection of bi-morph leaf 10C.

When the drive voltage is $-E < -2V_z$, diode 33 is reverse biased to cause Zener diode 34 to be in its OFF state, while diode 31 is forwardly biased to achieve the ON condition of Zener diode 32. Therefore, the constant relatively low voltage $V_z$ which is opposite to the poling direction of element 11C is applied to the latter, and the voltage $(E - V_z)$ is applied to the other element 12C for downwardly deflecting bi-morph leaf 10C.

It will be noted that the deflection sensitivity of bi-morph leaf 10C according to this invention is constant regardless of the value of the drive voltage. More particularly, when the absolute value of the drive voltage E is lower than $2V_z$, the voltage $\frac{1}{2}E$ is applied to each of the elements 11C and 12C. Therefore, the resulting deflection of bi-morph leaf 10C corresponds to the absolute value E of the drive voltage. When the absolute value of the drive voltage E is higher than $2V_z$, the Zener voltage $V_z$ is applied to one of the elements 11C and 12C, and the voltage $(E - V_z)$ is applied to the other of the plates 11C and 12C. Therefore, one of the elements 11C and 12C deflects in accordance with the voltage V while the other one of the elements 11C and 12C deflects in accordance with the voltage $(E - V_z)$ so that the total deflection of bi-morph leaf 10C corresponds to the voltage E.

It will also be appreciated that, since the Zener voltage V is a relatively low value, for example, between $\frac{1}{2}E_{max}$ and $\frac{1}{2}E_{max}$, as previously described, the application of such low voltage to one or the other of the elements 11C and 12C in the direction opposed to the poling direction will not effect any significant depolarization of such element.

If one of the polarities of the AC drive voltage from source 19C has a substantially limited absolute value, either the series circuit of diode 31 and Zener diode 32, or the series circuit of diode 33 and Zener diode 34 can be omitted from the drive circuit according to this invention.

Figure 6:
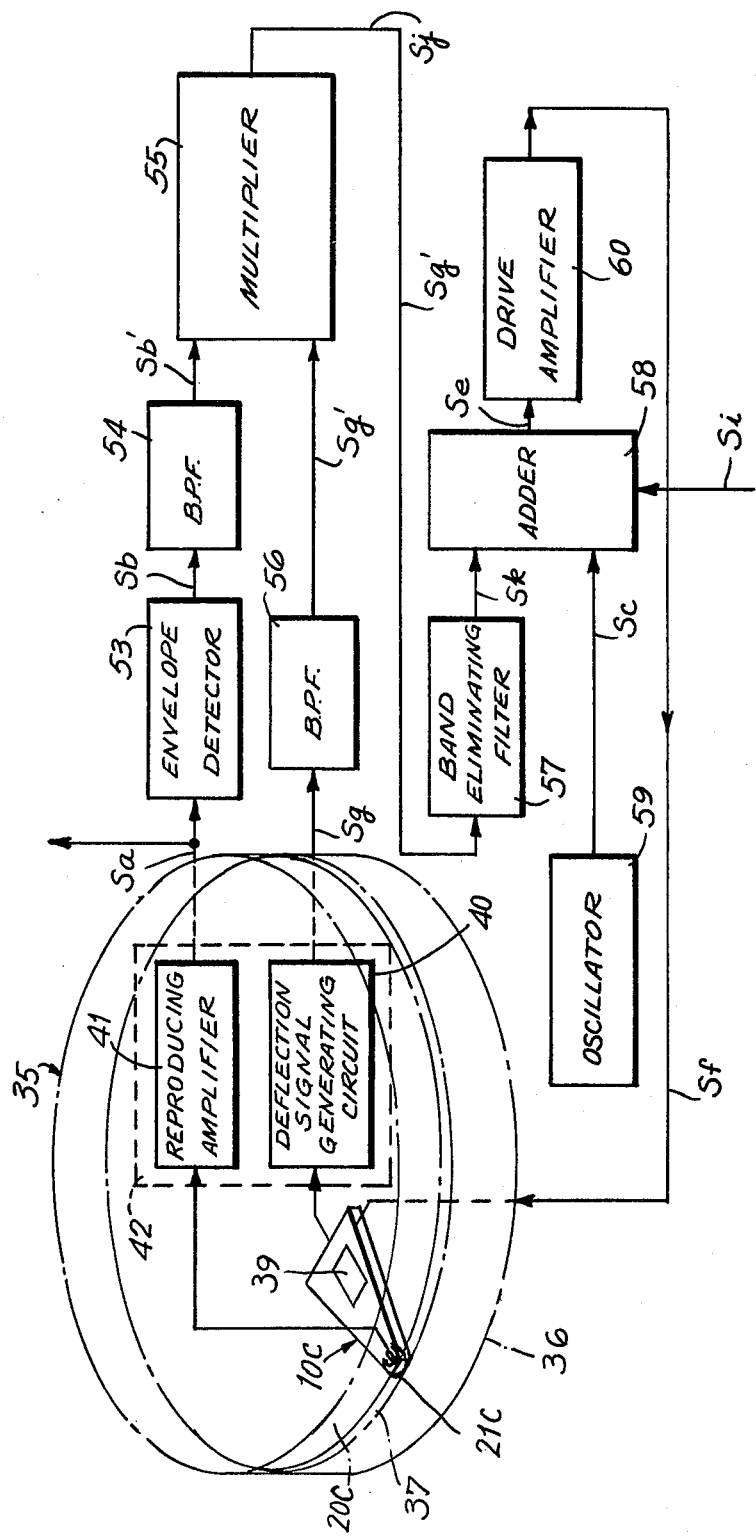
FIG. 6 is a diagrammatic view illustrating an automatic head tracking system for a video tape recorder which includes a bi-morph leaf and drive circuit therefor in accordance with this invention.

Referring now to FIG. 6, in which parts corresponding to those previously described with reference to FIG. 5 are identified by the same reference numerals, it will be seen that a bi-morph leaf 10C and a drive circuit therefor according to the present invention are there shown applied to an automatic head tracking system in a helical-scan video tape recorder. The illustrated video tape recorder has a guide drum which is shown in broken lines and generally identified by the reference numeral 35, and which includes a rotatable upper drum portion of conductive metal forming the support 20C for the bi-morph leaf 10C. Guide drum 35 further includes a stationary lower drum portion 36 with a radially opening circumferential slit 37 defined between drum portions 20C and 36. The bi-morph leaf 10C embodying this invention is fixed at its base or inner end portion to the bottom of rotatable upper drum portion 20C, for example, by means of a mounting bracket 38 which forms a conductive path between outer electrode 16C of leaf 10C and the conductive metal of drum portion 20C. Bi-morph leaf 10C is longitudinally dimensioned so that, when mounted in the foregoing manner, in respect to rotary drum portion 20C, magnetic head 21C in the form of a chip mounted at the free or outer end of the leaf extends through slit 37 and is movable vertically, or in the direction parallel to the axis of rotation of drum portion 20C, in response to the deflection of bi-morph leaf 10C by the application of a drive signal $S_f$ thereto. A magnetic tape (not shown) is intended to be wrapped helically, that is, at an angle to the plane of slit 37, about a substantial portion, for example, about one half, of the periphery of drum 35 so that, upon rotation of head 21C with upper drum portion 20C, head 21C scans obliquely across the magnetic tape and is simultaneously moved or oscillated in the direction normal to the scanning direction in response to the deflection of bi-morph leaf 10C.

Figure 7:
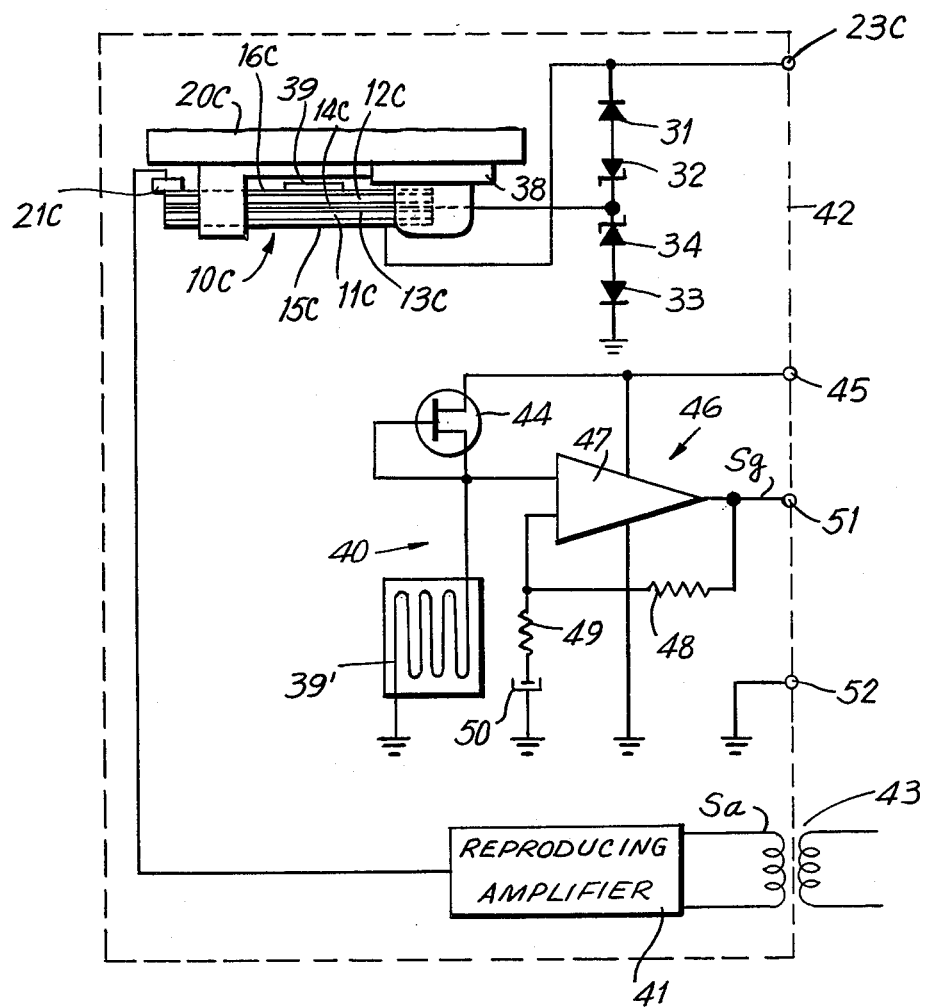
FIG. 7 is a circuit diagram showing details of a portion of the system illustrated on FIG. 6.

In an automatic head tracking system to which the present invention may be applied, as shown on FIGS. 6 and 7, a strain gauge 39 is secured to the surface of bi-morph 10C constituted by outer electrode 16C so as to be stressed variably in response to the deflection of the latter and to cooperate with an associated circuit 40 for generating a deflection detecting signal $S_g$ which indicates the extent and direction of deflection of head 21C from a rest position. In the automatic head tracking system of FIG. 6, the deflection signal generating circuit 40 and a reproducing amplifier 41 for amplifying the output of head 21C are included in a circuit assembly 42 which is suitably arranged within the rotary upper drum portion 20C of guide drum 35.

As shown on FIG. 7, the signals reproduced by head 21C, after being amplified by reproducing amplifier 41, are transferred from rotary drum portion 20C as a reproduced signal $S_a$ by means of a rotary transformer 43. On FIG. 7, strain gauge 39 is shown both in its actual position on outer electrode 16C of bi-morph leaf 10C and in a position remote from the latter, as at 39', for ease in illustrating its connection to the associated deflection-detecting circuit 40. The strain gauge 39 may be of the resistance-wire type to which a constant current is supplied by way of a field-effect transistor 44 which is connected to a suitable voltage source (not shown) by way of a slip ring indicated at 45. It will be apparent that deflection of bi-morph leaf 10C causes a corresponding change in the resistance of strain gauge 39, and hence in the voltage across the strain gauge which represents the deflection-detecting signal. Such deflection-detecting signal or voltage is amplified by an amplifier 46 which includes an operational amplifier 47, resistors 48 and 49 and a capacitor 50. The output of operational amplifier 47 is supplied, as the deflection-detecting signal $S_g$, to a slip ring 51 for application through the latter to the remainder of the tracking system shown on FIG. 6. Another slip ring 52 may be provided for connection to ground, the previously-mentioned slip ring 23C is provided for receiving the electrical drive signal $S_f$ for bi-morph leaf 10C.

It will be appreciated that, by reason of the connection to ground of outer electrode 16C of bi-morph leaf 10C, strain gauge 39 may be conveniently mounted on outer electrode 16C without superimposing the deflection-detecting signal $S_g$, which corresponds to the deflection of head 21C from its rest position, on the drive signal $S_f$ for bi-morph leaf 10C. Of course, as previously described, the grounding of outer electrode 16C of the bi-morph leaf 10C also permits the reproducing head 21C to be conveniently mounted directly on such outer electrode without superimposing of the reproduced video or other information signals on either the deflection-detecting signal or the drive signal. Moreover, the circuit arrangement of diodes 31 and 33 and Zener diodes 32 and 34 which are also included in circuit assembly 42 on FIG. 7, and through which the drive signal $S_f$ is applied to bi-morph leaf 10C on FIG. 7 functions, as previously described with reference to FIG. 5, to avoid depolarizing of piezo-ceramic elements 11C and 12C while ensuring that the bi-morph leaf has uniform sensitivity to the drive signal and all of the other advantages mentioned above in connection with FIG. 5.

Returning now to FIG. 6, it will be seen that, in the automatic head tracking system to which the invention is conveniently applied, the reproduced signal $S_a$ obtained through rotary transformer 43 from reproducing amplifier 41, and which is conventionally a frequency-modulated signal, is supplied to an envelope detecting circuit 53. As hereinafter described, signal $S_a$ is amplitude-modulated with a dither or oscillation signal $S_c$ having a fixed frequency $f_c$ which may be about 450 Hz. The amplitude variations of the output or envelope signal $S_b$ from envelope detecting circuit 53 represent, among other things, tracking errors which exist between the path of movement of head 21C and a record track on a magnetic tape guided by drum 35 and being scanned by the head. Envelope signal $S_b$ also includes unwanted frequency components in addition to the tracking error information at the dither or oscillation signal frequency $f_c$, such as, for example, frequency components at the primary and secondary resonant frequencies and at the anti-resonant frequency of bi-morph leaf 10C and various other frequency components due to transient responses. Such unwanted frequency components, which would adversely affect detection of and correction for the tracking error between the scanning path of head 21C and a record track on the magnetic tape, are eliminated by passing the envelope signal $S_b$ through a band pass filter 54 designed to pass a frequency band centered at the dither or oscillation frequency $f_c$ which contains the tracking error information. The resulting output signal $S_b'$ from band pass filter 54, which still contains the above described unwanted frequency components, is applied to one input of a multiplier or balanced modulator 55. The deflection-detecting signal $S_g$ obtained through slip ring 51 from detecting circuit 40 is applied to another band pass filter 56 which has substantially the same characteristic as filter 54 so that filter 56 is also adapted to pass a band of frequencies centered at the dither or oscillation frequency $f_c$. The resulting output signal $S_g'$ from filter 56 still contains the unwanted frequency components, such as, components at the first and second resonant and anti-resonant frequencies of bi-morph leaf 10C and various other frequency components due to the transient response, in addition to the component at the dither or oscillation frequency $f_c$. The signal $S_g$ or $S_g'$ represents the deflection of head 10C from its rest position, rather than the position of the head relative to the center of a track being scanned so that signal $S_g'$, when applied to another input of multiplier or balanced modulator 55, does not include any information in respect to the tracking error. Further, it will be appreciated that the frequency, phase and amplitude of the unwanted frequency components contained in deflection-indicating signal $S_g'$ substantially correspond to the frequency, phase and amplitude, respectively, of the corresponding unwanted frequency components contained in the envelope signal $S_b'$ obtained from filter 54. By reason of the foregoing, an output signal $S_j$ from multiplier or balanced modulator 55 which represents the difference or sum of the frequencies of the signals applied to the two inputs of multiplier 55 has eliminated therefrom the components of the dither or oscillation frequencies $f_c$ and components of the unwanted frequencies, such as, the first and second order resonant and anti-resonant frequencies of bi-morph leaf 10C.

The output signal $S_j$ from multiplier 55 contains the information in respect to the tracking errors and also a frequency component having the frequency $2f_c$ generated by the multiplier 55 and which is eliminated by a band eliminating filter 57. The filter 57 may be effective to block the passage therethrough of frequency components in a relatively narrow band centered at the frequency $2f_c$. As a result of the foregoing, the output of band eliminating filter 57 provides a tracking error signal $S_k$ which represents the deviation of head 21c from the center line of a record track being scanned thereby. The tracking error signal $S_k$ is applied to an adding circuit 58 in which it is added to a dither or oscillation signal $S_c$ obtained from an oscillator 59. The output or composite signal $S_e$ from adding circuit 58 is supplied to a drive circuit or amplifier 60 which provides a corresponding drive signal $S_f$ supplied through slip ring 23C to outer electrode 16C of bi-morph leaf 10C and to the voltage-dividing clamp circuit according to this invention constituted by diodes 31 and 33 and Zener diodes 32 and 34. It will be appreciated that such drive signal $S_f$ drives bi-morph leaf 10C so that the null position of head 21C, when oscillated in the direction transverse to the direction along a record track, corresponds to the center of such track considered in the transverse direction.

As is indicated schematically on FIG. 6, adding circuit 58 may further receive a signal $S_i$ of triangular waveform which, as is known, is applied in the slow or still motion reproducing mode of the video tape recorder to compensate for angular deviation of the path of rotary head 21C relative to the longitudinal direction of each record track on the magnetic tape resulting from the fact that the speed of longitudinal advancement of the tape, in the slow or still motion reproducing mode, is different from the normal speed of advancement of the tape during recording of each record track.

By way of summary, it is to be noted that, in the case of a bi-morph leaf and drive circuit therefor according to this invention, depolarizing of the piezo-electric or -ceramic elements of the bi-morph leaf is avoided without the need to provide a complicated or costly drive circuit, for example, as typified by the two drive amplifiers 27 and 29 and the two DC bias sources 28 and 30 required in the prior art circuit of FIG. 4. Further, when the bi-morph leaf according to this invention is to be mounted on a rotary member, for example, a rotary portion of the tape guide drum in a VTR, only the single slip ring 23C is required for transmitting the drive signal to the bi-morph leaf 10C. When the invention is applied to an automatic head tracking system, as described with reference to FIGS. 6 and 7, there is no need to provide insulation between the magnetic head 21C and the grounded outer electrode 16C of the bi-morph leaf, and the strain gauge 39 can be fixed directly on the grounded electrode 16C of the bi-morph leaf 10C without being influenced by the electric field.

Although a specific embodiment of the invention, and a particular application thereof have been described in detail herein with reference to the drawings, it is to be understood that the invention is not limited to that precise embodiment or application thereof, and that various changes and modifications may be effected therein by one skilled in the art without departing from the scope or spirit of the invention as defined in the appended claims.

What is claimed is:

1. An apparatus for reproducing information signals recorded in a track on a magnetic tape having said track extending obliquely thereon and being preceded and followed by similar tracks which are parallel thereto and also have information signals recorded therein; comprising a grounded guide drum, said tape extending helically about at least a portion of the periphery of said guide drum and being adapted to be longitudinally advanced, at least a portion of said guide drum being rotatable; transducer means movable along said track for reproducing the information signals recorded therein; transducer mounting means including a bi-morph leaf which is cantilevered at one end and carries said transducer means at the other end which is free to deflect in the direction transverse to the length of said track, said bi-morph leaf having a pair of electrically poled piezo-electric elements interposed between inner and outer electrodes with each of said elements being bonded to the other at the respective inner electrode, and with said elements being oppositely poled, said bi-morph leaf being mounted at said outer electrode of one of said piezo-electric elements on said rotatable portion of the guide drum so as to rotate with the latter and thereby scan along the one of the tracks positioned in proximity thereto by advancement of the tape; and a drive circuit for said bi-morph leaf including a source of AC drive voltage connected across said outer electrodes of said piezo-electric elements, respectively, for deflecting said transducer means in said transverse direction, said outer electrode of said one piezo-electric element being connected to ground and said source of the drive voltage being connected between the outer electrode of the other of said piezo-electric elements and said ground, first means for clamping, at a predetermined maximum value, the voltage at the bonded together inner electrodes at least in response to a polarity of said drive voltage opposed to the direction in which one of said piezo-electric elements is poled, and second means for clamping, at said relatively small maximum value, the voltage at said bonded together inner electrodes in response to the polarity of said drive voltage opposed to the direction in which the other of said piezo-electric elements is poled, in which each said first and second means for clamping the voltage includes unidirectional means connected across the respective piezo-electric element and permitting current flow in a direction opposed to the direction in which said respective element is poled, and voltage limiting means in series with said unidirectional means.

2. The apparatus according to claim 1; in which each said unidirectional means is constituted by a diode, and each said voltage limiting means is constituted by a Zener diode.

3. The combination of a piezo-electric transducer comprising a pair of electrically poled piezo-electric elements interposed between inner and outer electrodes with each of said elements being bonded to the other at the respective inner electrode, and with said elements being oppositely poled; and a drive circuit for said transducer comprising a source of a drive voltage connected across said outer electrodes of said piezo-electric elements, respectively, for deflecting said transducer, and means for clamping, at a predetermined maximum value, the voltage at the bonded together inner electrodes at least in response to a polarity of said drive voltage opposed to the direction in which one of said piezo-electric elements is poled, in which said means for clamping the voltage includes unidirectional means connected across said one piezo-electric element and permitting current flow in a direction opposed to said direction in which said one element is poled, and voltage limiting means in series with said unidirectional means.

4. The combination according to claim 3; in which said unidirectional means is constituted by a diode, and said voltage limiting means is constituted by a Zener diode.

5. The combination of a piezo-electric transducer comprising a pair of electrically poled piezo-electric elements interposed between inner and outer electrodes with each of said elements being bonded to the other at the respective inner electrode, and with said elements being oppositely poled; and a drive circuit for said transducer comprising a source of a drive voltage connected across said outer electrodes of said piezo-electric elements, respectively, for deflecting said transducer, and means for clamping, at a predetermined maximum value, the voltage at the bonded together inner electrodes at least in response to a polarity of said drive voltage opposed to the direction in which one of said piezo-electric elements is poled, in which said means for clamping the voltage includes a diode connected across said one piezo-electric element and permitting current flow in a direction opposed to said said direction in which said one element is poled, and a Zener diode in series with said unidirectional means and having a Zener voltage which is approximately between one-third and one-half the maximum voltage that may be applied to said one element in said direction in which the latter is poled to provide a substantially linear relation between the resulting deflection and said maximum voltage.

6. An apparatus for reproducing information signals recorded in a track on a record medium: comprising transducer means movable along said track for reproducing the information signals recorded therein; transducer mounting means including a bi-morph leaf which is cantilevered at one end and carries said transducer means at the other end which is free to deflect in the direction transverse to the length of said track, said bi-morph leaf having a pair of electrically poled piezo-electric elements interposed between inner and outer electrodes with each of said elements being bonded to the other at the respective inner electrode, and with said elements being oppositely poled and one of said elements having said outer electrode thereof connected to ground; and a drive circuit for said bi-morph leaf including a source of a drive voltage connected between said outer electrode of the other of said piezo-electric elements and said ground for deflecting said transducer means in said transverse direction, and means for clamping, at a predetermined maximum value, the voltage at the bonded together inner electrodes at least in response to a polarity of said drive voltage opposed to the direction in which one of said piezo-electric elements is poled.

7. The apparatus according to claim 6; in which said record medium is a magnetic tape having said track extending obliquely thereon and being preceded and followed by similar tracks which are parallel thereto and also have information signals recorded therein, said tape extends helically about at least a portion of the periphery of a grounded guide drum and is adapted to be longitudinally advanced, at least a portion of said guide drum is rotatable, and said bi-morph leaf is mounted at said outer electrode of said one piezo-electric element on said rotatable portion of the guide drum so as to rotate with the latter and thereby scan along the one of the tracks positioned in proximity thereto by advancement of the tape.

8. The apparatus according to claim 7; in which said drive voltage is an AC voltage, and said drive circuit further includes means for clamping, at said predetermined maximum value, the voltage at said bonded together inner electrodes in response to the polarity of said drive voltage opposed to the direction in which the other of said piezo-electric elements is poled.

9. The apparatus according to claim 8; further comprising deflection signal generating means for generating a deflection signal in correspondence to the deflection of said transducer means in said transverse direction from a rest position; and in which said source of a drive voltage includes oscillating means for providing a dither oscillation signal which, on application to said bi-morph leaf, causes said transducer means to oscillate in said transverse direction about a null position, envelope detecting means for detecting the envelope of the output of said transducer means as the latter moves along a track and oscillates in said transverse direction, means for synchronously demodulating the detected envelope from said envelope detecting means by means of said deflection signal so as to obtain a tracking error signal representative of the deviation of said null position of the transducer means from the center of the track considered in said transverse direction, and means for adding said tracking error signal and said dither oscillation signal to provide said drive voltage for said bi-morph leaf.

10. The apparatus according to claim 9; in which said deflection signal generating means includes a strain gauge secured on said outer electrode which is connected to ground so as to be stressed in accordance with the flexing of said bi-morph leaf, and a circuit for providing said deflection signal in accordance with the stressing of the strain gauge.

11. The combination of a piezo-electric transducer comprising a pair of electrically poled piezo-electric elements interposed between inner and outer electrodes with each of said elements being bonded to the other at the respective inner electrode, and with said elements being oppositely poled; and a drive circuit for said transducer comprising a source of AC drive voltage connected across said outer electrodes of said piezo-electric elements, respectively, for deflecting said transducer, first means for clamping, at a predetermined maximum value, the voltage at the bonded together inner electrodes at least in response to a polarity of said drive voltage opposed to the direction in which one of said piezo-electric elements is poled, and second means for clamping, at said predetermined maximum value, the voltage at said bonded together inner electrodes in response to the polarity of said drive voltage opposed to the direction in which the other of said piezo-electric element is poled, in which each said first and second means for clamping the voltage includes unidirectional means connected across the respective piezo-electric elements and permitting current flow in a direction opposed to the direction in which said respective element is poled, and voltage limiting means in series with said unidirectional means.

12. The combination according to claim 11; in which each said unidirectional means is constituted by a diode, and each said voltage limiting means is constituted by a Zener diode.

13. The combination according to claim 12; in which said outer electrode of one of said piezo-electric elements is connected to ground, and said source of the drive voltage is connected between said outer electrode of the other of said piezo-electric elements and said ground.

* * * * *

Disclaimer 4,237,399.—*Hitoshi Sakamoto*, Kanagawa-Ken, Japan. DRIVING CIRCUIT OR PIEZO-ELECTRIC MULTIMORPH TRANSDUCER. Patent dated Dec. 2, 1980. Disclaimer filed, Aug. 27, 1981, by the assignee, *Sony Corp.*

Hereby enters this disclaimer to claims 3, 4, 11 and 12 of said patent.

[*Official Gazette November 24, 1981.*]